(12) United States Patent
Ragonese et al.

(10) Patent No.: US 9,948,193 B2
(45) Date of Patent: Apr. 17, 2018

(54) GALVANICALLY ISOLATED DC-DC CONVERTER WITH BIDIRECTIONAL DATA TRANSMISSION

(71) Applicant: STMicroelectronics S.r.l., Agrate Brianza (IT)

(72) Inventors: Egidio Ragonese, Aci Catena (IT); Nunzio Spina, Catania (IT); Pierpaolo Lombardo, Calascibetta (IT); Nunzio Greco, Bronte (IT); Alessandro Parisi, Mascalucia (IT); Giuseppe Palmisano, S. Giovanni La Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/178,822

(22) Filed: Jun. 10, 2016

(65) Prior Publication Data

US 2017/0358993 A1    Dec. 14, 2017

(51) Int. Cl.
*H02M 3/335* (2006.01)

(52) U.S. Cl.
CPC ... *H02M 3/33553* (2013.01); *H02M 3/33523* (2013.01); *H02M 3/33584* (2013.01)

(58) Field of Classification Search
CPC ............. H02M 3/335; H02M 3/33523; H02M 3/33553; H02M 3/33584
See application file for complete search history.

(56) References Cited

U.S. PATENT DOCUMENTS

| | | | |
|---|---|---|---|
| 6,466,126 B2 | 10/2002 | Collins et al. | |
| 7,489,526 B2 | 2/2009 | Chen et al. | |
| 7,701,732 B2 | 4/2010 | Ranstad | |
| 7,706,154 B2 | 4/2010 | Chen et al. | |
| 7,737,871 B2 | 6/2010 | Leung et al. | |
| 7,983,059 B2 | 7/2011 | Chen | |
| 8,084,894 B2 | 12/2011 | Chen | |
| 8,364,195 B2 | 1/2013 | Spina et al. | |
| 8,610,312 B2 | 12/2013 | Kikuchi | |
| 8,618,630 B2 | 12/2013 | Kaeriyama | |
| 8,674,486 B2* | 3/2014 | Haigh ............... H01L 23/49503 257/676 |

(Continued)

FOREIGN PATENT DOCUMENTS

WO    WO-2005122423 A2    12/2005

OTHER PUBLICATIONS

"Surging Across the Barrier: Digital Isolators Set the Standard for Reinforced Insulation," Analog Devices, Inc., Tech. Article, 2012, MS-2341 (5 pages).

(Continued)

*Primary Examiner* — Fred E Finch, III
(74) *Attorney, Agent, or Firm* — Gardere Wynne Sewell LLP

(57) ABSTRACT

A galvanic isolation is provided between a first circuit and a second circuit. A first galvanically isolated link is configured to transfer power from a first circuit to a second circuit across the galvanic isolation. A second galvanically isolated link is configured to feed back an error signal from the second circuit to the first circuit across the galvanic isolation for use in regulating the power transfer and further configured to support bidirectional data communication between the first and second circuits across the galvanic isolation.

13 Claims, 5 Drawing Sheets

(56) References Cited

U.S. PATENT DOCUMENTS

| | | | |
|---|---|---|---|
| 8,680,690 | B1 | 3/2014 | Steeneken et al. |
| 8,861,229 | B2 | 10/2014 | Alfano et al. |
| 8,912,906 | B2 | 12/2014 | Taniguchi et al. |
| 2004/0189271 | A1* | 9/2004 | Hansson .......... H02M 3/33515 323/283 |
| 2004/0210349 | A1* | 10/2004 | Lenz ................ H02M 3/33515 700/286 |
| 2004/0217749 | A1* | 11/2004 | Orr .................. H02M 3/33569 323/299 |
| 2007/0121832 | A1* | 5/2007 | Ghoshal ................ H04L 12/10 379/93.36 |
| 2008/0181316 | A1* | 7/2008 | Crawley ................ H04L 12/10 375/258 |
| 2008/0192509 | A1* | 8/2008 | Dhuyvetter ....... H02M 3/33523 363/17 |
| 2008/0231211 | A1* | 9/2008 | Baarman .......... H02M 3/33523 315/294 |
| 2008/0267212 | A1* | 10/2008 | Crawley .............. H05K 9/0066 370/463 |
| 2009/0168462 | A1* | 7/2009 | Schopfer .......... H02M 3/33523 363/21.01 |
| 2009/0327783 | A1* | 12/2009 | Doss ................. H02M 3/33515 713/340 |
| 2010/0052630 | A1 | 3/2010 | Chen |
| 2012/0099345 | A1* | 4/2012 | Zhao ..................... H02M 1/36 363/21.05 |
| 2012/0256290 | A1 | 10/2012 | Renna et al. |
| 2013/0188399 | A1* | 7/2013 | Tang .................... H02M 3/335 363/21.1 |
| 2014/0253225 | A1* | 9/2014 | Lee .................... H04L 25/4902 327/535 |
| 2014/0268917 | A1* | 9/2014 | Ma .................... H02M 3/33523 363/21.15 |
| 2014/0292419 | A1 | 10/2014 | Ragonese et al. |
| 2014/0313784 | A1* | 10/2014 | Strzalkowski .... H02M 3/33584 363/17 |
| 2015/0123749 | A1 | 5/2015 | Li et al. |
| 2015/0180528 | A1 | 6/2015 | Ragonese et al. |
| 2015/0326127 | A1* | 11/2015 | Peng ................. H05B 33/0815 315/209 R |
| 2015/0364249 | A1 | 12/2015 | Palumbo et al. |
| 2016/0080181 | A1 | 3/2016 | Yun et al. |

OTHER PUBLICATIONS

Cantrell: "Reinforced Isolation in Data Couplers," Analog Devices, Inc., Tech. Article, 2011, MS-2242 (4 pages).

Chen: "Fully Integrated Isolated DC-DC Converter Using Micro Transformers," Proc. IEEE Applied Power Electronics Conference and Exposition, (APEC), pp. 335-338, Feb. 2008.

Chen: "Isolated Half-Bridge Gate Driver With Integrated High-Side Supply," Proc. IEEE Power Electronics Specialists Conf. (PESC) pp. 3615-3618, Jun. 2008.

Chen: "Microtransformer Isolation Benefits Digital Control," Power Electronics Technology, pp. 20 25, Oct. 2008.

Chen: "iCoupler® Products with isoPower™ Technology: Signal and Power Transfer Across Isolation Barrier Using Microtransformers," Technical Article, Analog Devices, USA, http://www.analog.com/static/imported files/overviews/isoPower.pdf (4 pages).

Greco et al: "A Galvanically Isolated DC-DC Converter Based on Current-Reuse Hybrid-Coupled Oscillators," IEEE Trans. Circuits Syst. II, early access Mar. 2016 (5 pages).

Kamath et al: "High-Voltage Reinforced Isolation: Definitions and Test Methodologies," Texas Instruments, Tech. Article, Nov. 2014, SLYY063 (10 pages).

Lombardo et al: "A Fully-Integrated Half-Duplex Data/Power Transfer System With Up to 40Mbps Data Rate, 23mW Output Power and On-Chip 5kV Galvanic Isolation," IEEE International Solid-State Circuits Conference (ISSCC), San Francisco, USA, Feb. 2016, pp. 300-301.

Marwat: "Digital Isolators Compliance to IEC 61010-1 Edition 3.0 Safety Requirements," Texas Instruments, White Paper, 2014, SLYY055 (5 pages).

Spina, et al: "Current-Reuse Transformer Coupled Oscillators With Output Power Combining for Galvanically Isolated Power Transfer Systems," IEEE Transaction on Circuits and Systems I, vol. 62, pp. 2940-2948, Dec. 2015.

"Techniken Zur Galvanischen Trennung von Schaltungen Und Deren Praktische Umsetzung," Technology Day, Nürnberg Jun. 18, 2009, Texas Instruments Inc. (54 pages).

Wayne, Scott: "iCoupler(R) Digital Isolators Protect RS-232,RS-485, and CAN Buses in Industrial, Instrumentation, and Computer Applications," www.analog.com, Analog Dialogue 39-10, Oct. 2005, (4 pages).

* cited by examiner

GALVANICALLY ISOLATED DC-DC CONVERTER WITH BIDIRECTIONAL DATA TRANSMISSION

TECHNICAL FIELD

The description herein relates to galvanic isolation systems and, in particular, to a galvanic isolation system implementing a DC-DC converter with bidirectional data transmission.

BACKGROUND

A large number of applications require the transfer of power and data through a galvanic isolation barrier with an isolation rating of several kilovolts. Such applications span several fields including industrial (e.g., high-side gate drivers), medical (e.g., implantable devices), isolated sensor interfaces and lighting. The industry standard VDE 0884-10 has been developed to expressly take into account the availability of highly integrated semiconductor isolators with micro-scale isolation barriers, either using magnetic or capacitive transfer techniques.

FIG. 1 generally illustrates these applications where a first interface and a second interface are coupled through a galvanic isolation barrier supporting both power transfer from the first interface (circuit or chip) to the second interface (circuit or chip) and bidirectional data transmission between the first and second interfaces. The first interface (circuit or chip) may, for example, be associated with a first power domain referenced to supply nodes $V_{DD1}/GND_1$. The second interface (circuit or chip) may, for example, be associated with a second power domain referenced to supply nodes $V_{DD2}/GND_2$, where $V_{DD1}$ may not equal $V_{DD2}$ and $GND_1$ may not equal $GND_2$. The galvanic isolation barrier may further address concerns with electromagnetic interference (EMI) and ground shifts. In an example implementation, the first interface may be associated with circuitry for human/data interfaces, bus/network controllers, microcontrollers (µCU), etc., while the second interface may be associated with circuitry for sensor interfaces, gate drivers, medical devices, communications networks, etc.

It is known in the art to use either post-processed or integrated isolation capacitors to perform galvanically isolated data communication. See, for example, Marwat, "Digital isolators compliance to IEC 61010-1 edition 3.0 safety requirements," Texas Instruments, White Paper, 2014, SLYY055 (incorporated by reference). Typically, capacitive isolators use a two-chip solution (i.e., RX and TX), exploiting either RF amplitude modulation or impulsive transmission. Capacitors may be integrated with a thick isolating layer (e.g. $SiO_2$) to achieve galvanic isolation. Isolation rating values higher than a few kilovolts may involve both technological and cost issues; and this solution may be penalizing in terms of larger area due to a lower capacitance density. Also, in certain implementations only data transfer (and not power transfer) may be achieved because capacitive isolation techniques are not well suited to power transfer due to the highly detrimental voltage partition at the input of the power rectifier. Additionally, common-mode transient (CMT) immunity (dV/dt) may become a critical factor due to high capacitive coupling.

It is also known to use transformer based isolators for data transmission. This solution is generally less sensitive to common-mode transients (CMT) when compared to isolation capacitors thanks to lower capacitive parasitics. Such isolation transformers are generally implemented by means of post-processed isolation transformers, possibly using polyimide isolation layers. Isolation rating values higher than 5 kV may be achieved with thick layers (for example, >20 microns) at the cost of a lower magnetic coupling. See, Chen, "iCoupler® products with isoPower™ technology: signal and power transfer across isolation barrier using microtransformers," Technical Article, Analog Devices, USA, http://www.analog.com/static/imported files/overviews/isoPower.pdf (incorporated by reference).

Transfer of both data and power may be available using, for example, different transformer links. Thus, post processed isolation transformers can be exploited to transfer power with high efficiency by using a dedicated link made up of a power oscillator (i.e., the dc-ac converter) and a rectifier (i.e., the ac-dc converter). See, for example, United States Patent Application Publication No. 2010/0052630 (incorporated by reference); Chen, "Fully integrated isolated dc-dc converter using micro transformers," Proc. IEEE Applied Power Electronics Conference and Exposition, (APEC), pp. 335-338, February 2008 (incorporated by reference); and Chen, "Isolated half-bridge gate driver with integrated high-side supply," Proc. IEEE Power Electronics Specialists Conf. (PESC) pp. 3615-3618, June 2008 (incorporated by reference).

Examples of integrated transformers able to sustain isolation of several kilovolts have been developed. See, United States Patent Application Publication No. 2015/0364249 (incorporated by reference). Based on this technology, galvanically isolated data transfer systems are already available. See, Pulvirenti, et al., "Dispositivi con isolamento galvanico integrato", Convegno Annuale 2014 dalla ricerca all'impresa: necessità di un trasferimento più efficace, Trieste, September 2014 (incorporated by reference). Additionally, high efficiency power transfer has been demonstrated. See, Spina, et al., "Current-reuse transformer coupled oscillators with output power combining for galvanically isolated power transfer systems," IEEE Transaction on Circuits and Systems I, vol. 62, pp. 2940-2948, December 2015 (incorporated by reference); Lombardo, et al., "A fully-integrated half-duplex data/power transfer system with up to 40 Mbps data rate, 23 mW output power and on-chip 5 kV galvanic isolation," IEEE International Solid-State Circuits Conference (ISSCC), San Francisco, USA, February 2016, pp. 300-301 (incorporated by reference); and Greco, et al., "A galvanically isolated dc dc converter based on current-reuse hybrid-coupled oscillators," IEEE Trans. Circuits Syst. II, March 2016 (incorporated by reference).

The main advantages and drawbacks of the above described isolation approaches are summarized in the following table:

| Isolation approaches | Advantages | Drawbacks |
| --- | --- | --- |
| Integrated capacitors | On-chip galvanic isolation<br>Data transfer available | Trade-off cost/area and isolation<br>CMT additional circuitry required |
| Post-processed transformer | Data and power transfer available<br>High CMT immunity for data transfer<br>High galvanic isolation rating | Low level of integration<br>Efficiency degradation at high isolation rating |
| Integrated transformers | On-chip galvanic isolation<br>Data transfer products<br>High CMT immunity for data transfer | Limited isolation rating due to oxide thickness |

| Isolation approaches | Advantages | Drawbacks |
|---|---|---|
| | Power transfer demonstrated | |

Commercial isolated dc-dc converters typically adopt a traditional architecture that consists of: an isolated link for the power transmission (isolated power channel), which is typically made of a very high frequency (VHF) power oscillator, an isolation transformer and a power rectifier; a further isolated link for the feedback path used to control the output power (typically by means of PWM modulation of the power oscillator); and several dedicated isolated links, for example for each data channel. Of course, these architectures require at least three isolation transformers, one for the power channel, one for the feedback control channel and one for the data channel.

An alternative architecture for an isolated dc-dc converter is proposed by United States Patent Application Publication No. 2015/0180528 (incorporated by reference). FIG. 2 shows a simplified representation of this solution. FIG. 3 shows a circuit schematic. The main idea here is to use the isolated power channel also for a bidirectional (half-duplex) data communication by means of an amplitude shift keying (ASK) modulation of the power signal at the primary or the secondary windings of the isolation transformer. Proper demodulation circuitries are included to recover the data stream and clock bit stream on both the first and second interfaces.

In FIG. 3, a power oscillator apparatus includes a transformer 50 having a primary winding 51 and a secondary winding 300.

A first outgoing communications circuit 210 is coupled between the primary winding 51 and a first interface 200, and serves to encode, modulate, and prepare for transmission data across the galvanic barrier at speeds on the order of hundreds of kilobits. A first incoming communications circuit 212 is coupled between the primary winding 51 and the first interface 200, and serves to receive, demodulate, and decode data transmitted from across the galvanic barrier. The first interface 200 delivers a clock signal CLK IN and a low speed (LS) BITSTREAM to the first outgoing communications circuit 210 to be used for the transmission of the data across the galvanic barrier, and receives the clock signal CLK OUT and the high speed (HS) BITSTREAM from the first incoming communications circuit 212. It should be appreciated that the communications are half-duplex, and that the first outgoing communications circuit 210 and the first incoming communications circuit 212 are therefore not active at the same time. Also, the CLK IN and CLK OUT signals are not related.

A DC/AC converter 225 is coupled to the primary winding 51 to effectuate power transfer, and ultimately data transfer, to the secondary winding 300. An optional divider 220 is coupled between the DC/AC converter 225 and the primary winding 51, and serves to extract a reference frequency Frf to be used by the first incoming communications circuit 212 and first outgoing communications circuit 210 for decoding and encoding. The reference frequency Frf may be used by the first interface 200 in generating the clock signal CLK IN.

The first outgoing communications circuit 210 includes a first encoder 1ENC coupled to the first interface 200 to receive therefrom the bitstream LS BITSTREAM and the clock signal CLK IN, and to generate therefrom data signal to be passed to a first modulator 1MOD coupled thereto. The first modulator 1MOD receives the data signal and modulates the data signal, via amplitude modulation, such that it can be driven to the secondary winding 300 by the primary winding 51.

The first incoming communications circuit 212 includes a first demodulator 1DEMOD coupled to the primary winding 51 to receive therefrom an amplitude modulated data signal and demodulates the amplitude modulated data signal to produce a received data signal. A first decoder 1DECOD is coupled to the first demodulator 1DEMOD to receive therefrom the received data signal, and decodes the received high speed data signal and passes a resulting decoded high speed data signal HS BITSTREAM to the first interface 200 together with the clock signal CLK OUT.

An AC/DC converter 70, such as a rectifier/regulator is coupled to the secondary winding 300 and is powered by the power transferred from the DC/AC converter 225, across the galvanic barrier, via the primary winding 51. The AC/DC converter 70 outputs an isolated voltage supply to the second interface 202.

A second outgoing communications circuit 214 is coupled between a second interface 202 and the secondary winding 300, and serves to encode, modulate, and prepare the data for transmission across the galvanic barrier at speeds on the order of tens of megabits. A second incoming communications circuit 216 is coupled between the second interface 202 and the secondary winding 300, and serves to receive, demodulate, and decode the data transmitted across the galvanic barrier. The second interface 202 delivers the clock signal and the bitstream to the second outgoing communications circuit 214 to be used for the transmission of the data across the galvanic barrier, and receives the clock signal and the data from the second outgoing communications circuit 214.

The second outgoing communications circuit 214 includes a second encoder 2ENC coupled to the second interface 202 to receive therefrom the bitstream HS BITSTREAM and a clock signal CLK IN, and generates therefrom a data signal. A second modulator 2MOD is coupled to the second encoder 2ENC to receive therefrom the data signal and modulates the data signal, via amplitude modulation, into a modulated data signal to be driven to the secondary winding 300 for transmission across the galvanic barrier.

The second incoming communications circuit 216 includes a second demodulator 2DEMOD coupled to the secondary winding 300 to receive therefrom an amplitude modulated data signal and demodulates the amplitude modulated data signal to produce a received data signal. A second decoder 2DECOD is coupled to the second demodulator 2DEMOD to receive therefrom the received data signal, and decodes the received data signal into a decoded data signal to be passed to the second interface 202.

An optional divider 221 is coupled between the secondary winding 300 and the second interface 202, and serves to extract a reference frequency Frf to be used by the second incoming communications circuit 216 and second outgoing communications circuit 214 for decoding and encoding.

The system in FIG. 3 is a general scheme that can be used in different application fields. Typically, interface 200 is a microcontroller, while interface 202 is an isolated front-end e.g., isolated RS-485 transceivers, isolated CAN transceivers, isolated RS-232 transceivers, isolated I$^2$C transceivers, isolated ADC, isolated USB transceivers, etc.

The circuits described above with reference to FIG. 3 allow the transfer of power and data across a galvanic barrier using the same transformer. This reduces the complexity and cost as compared to other prior art circuits. Unfortunately, the foregoing approach presents several drawbacks as follows:

Variable power functionality is not compatible with data transmission: Data communication requires the presence of the power signal and this is not compatible with typical power control that exploits an on/off modulation (i.e., PWM modulation) of the power oscillator to preserve efficiency. Therefore, this solution cannot be used when a variable/ controlled output power is required. Moreover, it also needs an output voltage regulator.

Maximum data bitrate is limited by the ratio of carrier frequency to data rate: Since data transmission is implemented as modulation of the power signal, the maximum bit rate is limited by the ratio of power signal frequency (i.e., carrier frequency) and data signal frequency. The power signal frequency is the result of a design tradeoff to maximize system efficiency and therefore cannot be increased to improve the data rate. As a consequence, at high data rates, the demodulation is critical and requires customized demodulation circuitry.

The architecture is not suited to high power applications (i.e., the power level is limited to a few tens of milliWatts) due to contrasting specs on the transformer size (power vs. CMT immunity): Higher power applications require larger isolation power transformers and hence there are higher parasitic capacitances between primary and secondary windings of the isolation transformer. This limits the CMT immunity performance of the data transmission channel, since injected current due to CMTs are proportional to parasitic primary-to-secondary capacitances (i.e. I=C dV/dt). Therefore, the architecture can be used only at low power levels with small isolation transformers.

Data transmission significantly affects the overall power efficiency: Since data transmission is obtained as ASK modulation of the power signal, communication affects the overall output power level and power efficiency, especially if a high modulation index is used to improve system robustness in terms of bit error rate (BER).

SUMMARY

In an embodiment, a galvanic isolation system comprises: a first galvanically isolated link configured to transfer power from a first circuit to a second circuit across a galvanic barrier; and a second galvanically isolated link configured to feed back an error signal from the second circuit to the first circuit across the galvanic barrier for use in regulating the power transfer and further configured to support bidirectional data communication between the first and second circuits across the galvanic barrier.

The first galvanically isolated link comprises: a first oscillator of the first circuit; and a first transformer having a primary winding coupled to outputs of the first oscillator and a secondary winding coupled to the second circuit.

The second galvanically isolated link comprises: a second oscillator of the second circuit configured for operation responsive to said error signal; and a second transformer having a primary winding coupled to outputs of the second oscillator and a secondary winding coupled to the first circuit.

A rectifier circuit is coupled to the secondary winding of the first transformer and configured to convert the power transfer to a DC output voltage. An error amplifier is configured to determine a difference between the DC output voltage and a reference voltage in order to generate said error signal. The error signal changes the peak amplitude of an oscillator signal generated by said second oscillator.

The first circuit includes a detector circuit coupled to the secondary winding of the second transformer and configured to detect said amplitude to generate an output signal. A control circuit responsive to said control signal is configured to control the first oscillator to regulate power transfer from the first circuit to the second circuit across the galvanic barrier.

In one implementation, a data modulator circuit has outputs coupled to the primary winding of the second transformer, with the data modulator operating to modulate data onto a signal at the primary winding of the second transformer for communication across the galvanic barrier. A data demodulator circuit having inputs coupled to the secondary winding of the second transformer operates to demodulate the data from a signal at the secondary winding of the second transformer.

In another implementation, a data modulator circuit has outputs coupled to the secondary winding of the second transformer, with the data modulator operating to modulate data onto a signal at the secondary winding of the second transformer for communication across the galvanic barrier. A data demodulator circuit having inputs coupled to the primary winding of the second transformer operates to demodulates the data from a signal at the primary winding of the second transformer.

BRIEF DESCRIPTION OF THE DRAWINGS

One or more embodiments will now be described, by way of example only, with reference to the annexed figures, wherein.

DETAILED DESCRIPTION

Given the state of the art of dc-dc converters with data communication, it is clear that reducing the number of required isolated links would represent an important advance in terms of size and cost. Of course, this has to be implemented without significantly affecting the overall performance of the converter.

The present disclosure concerns an architecture for a galvanically isolated dc-dc converter with bidirectional data transmission. The architecture adopts an isolated link to transfer power with high efficiency, while a feedback link is used to control the output dc voltage and is further exploited to implement a bidirectional half duplex communication by means of a proper modulation of the control signal (i.e., ASK, FSK, or any other modulation which preserves the peak control signal containing the control information).

Figure 1:
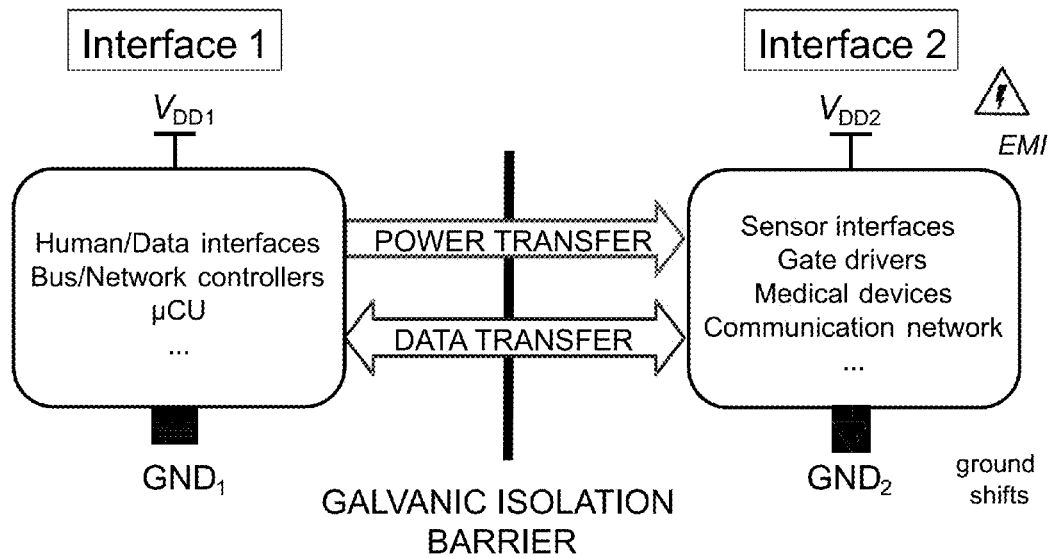
FIG. 1 generally illustrates an application for transfer of power and data through a galvanic isolation barrier.
Figure 2:
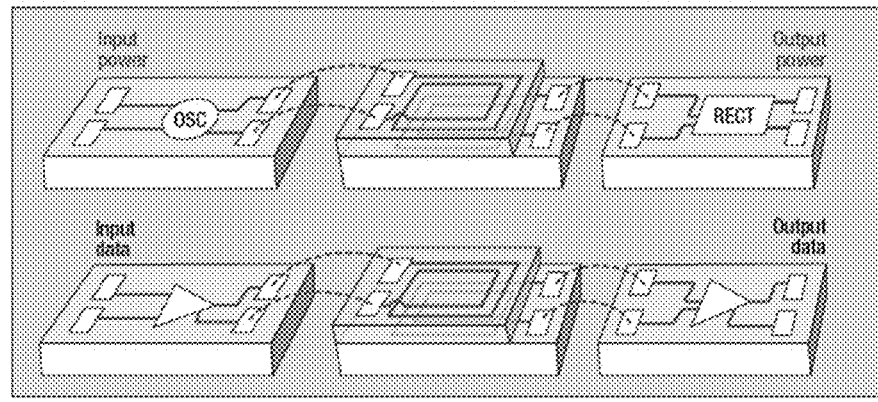
FIG. 2 illustrates an architecture for an isolated dc-dc converter.
Figure 3:
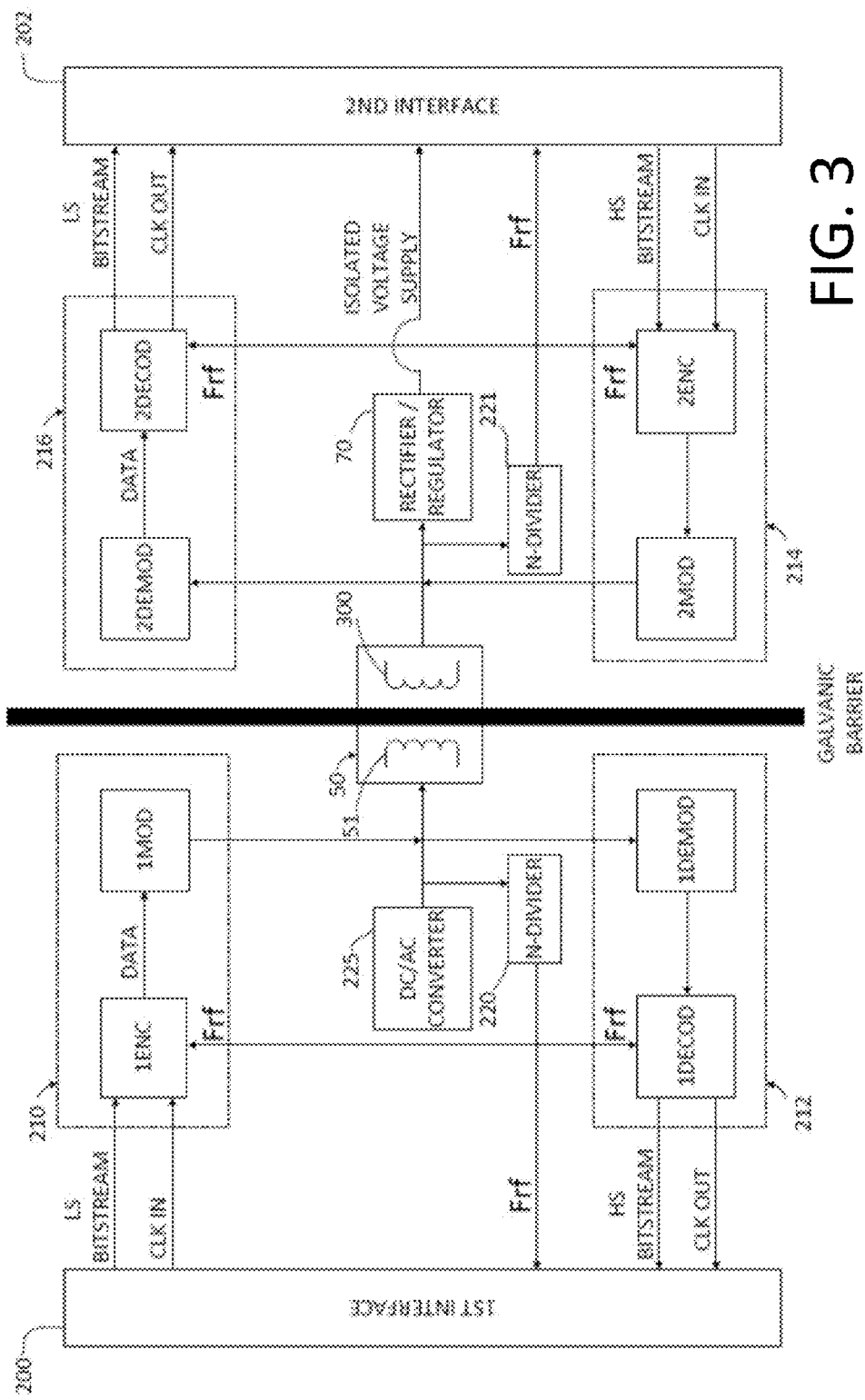
FIG. 3 is a circuit diagram for an isolated dc-dc converter.
Figure 4:
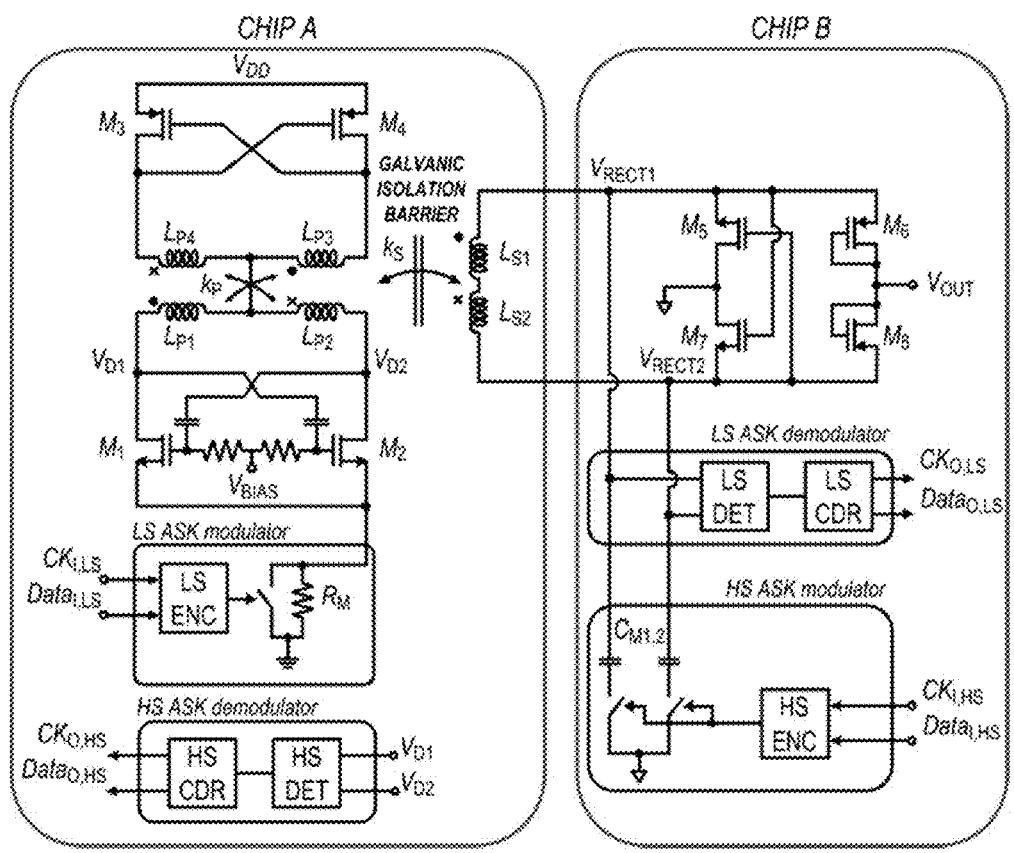
FIG. 4 illustrates an architecture for a galvanically isolated dc-dc converter with bidirectional data transmission.

An example architecture for a galvanically isolated dc-dc converter with bidirectional data transmission is shown in FIG. 4. This solution uses one isolated channel for power and data. A first chip (Chip A) includes an oscillator circuit formed by transistors M1, M2, M3 and M4 with primary transformer windings LP1, LP2, LP3 and LP4 of the primary side of the galvanic isolation barrier. Windings LP1 and LP2 are coupled in series at a first node, and windings LP3 and LP4 are coupled in series at a second node. The first and second nodes are shorted to each other. A capacitor network cross-couples the gates and drains of transistors MP1 and MP2, and a resistor network biases the gates of transistors MP1 and MP2. The gates and drains of transistors M3 and M4 are cross-coupled. A first data modulator circuit (for example, of the low speed (LS) amplitude shift keying (ASK) type) is coupled to the source terminals of the transistors M1 and M2. This first data modulator circuit includes an LS encoder (ENC) controlling a switch that selectively shorts across a resistor RM coupling the source terminals of transistors M1 and M2 to a first ground reference terminal. A first data demodulator circuit (for example, of the high speed (HS) ASK type) is coupled to the drain terminals of the transistors M1 and M2. The first data demodulator circuit includes a demodulator and detector (DET) circuit and a clock and data recovery (CDR) circuit. The secondary side of the transformer includes secondary transformer windings LS1 and LS2 coupled in series, with the winding LS1 magnetically coupled to LP1 and LP3 and the winding LS2 magnetically coupled to LP2 and LP4. A second chip (Chip B) includes a rectifier circuit formed by transistors M5, M6, M7 and M8 coupled to nodes Vrect1 and Vrect2 at the terminals of the secondary winding and configured to generate an output voltage Vout from the power transferred across the galvanic isolation. The gates and sources of the transistors M5 and M7 are cross-coupled with the drain nodes tied to a second ground reference, and the transistors M6 and M8 are configured as diode devices coupled to the voltage output node. A second data modulator circuit (for example of the HS ASK type) is coupled to the series coupled secondary windings at nodes Vrect1 and Vrect2. The second data modulator circuit includes an HS encoder (ENC) controlling switches that selectively connect the ends of the series coupled secondary windings LS1 and LS2 at nodes Vrect1 and Vrect2 through capacitors CM1 and CM2 to a second ground reference terminal. A second data demodulator (for example, of the LS ASK type) is also coupled to the series coupled secondary windings at nodes Vrect1 and Vrect2. The second data demodulator circuit includes a demodulator detector (DET) circuit and clock and data recovery (CDR) circuit.

Figure 5:
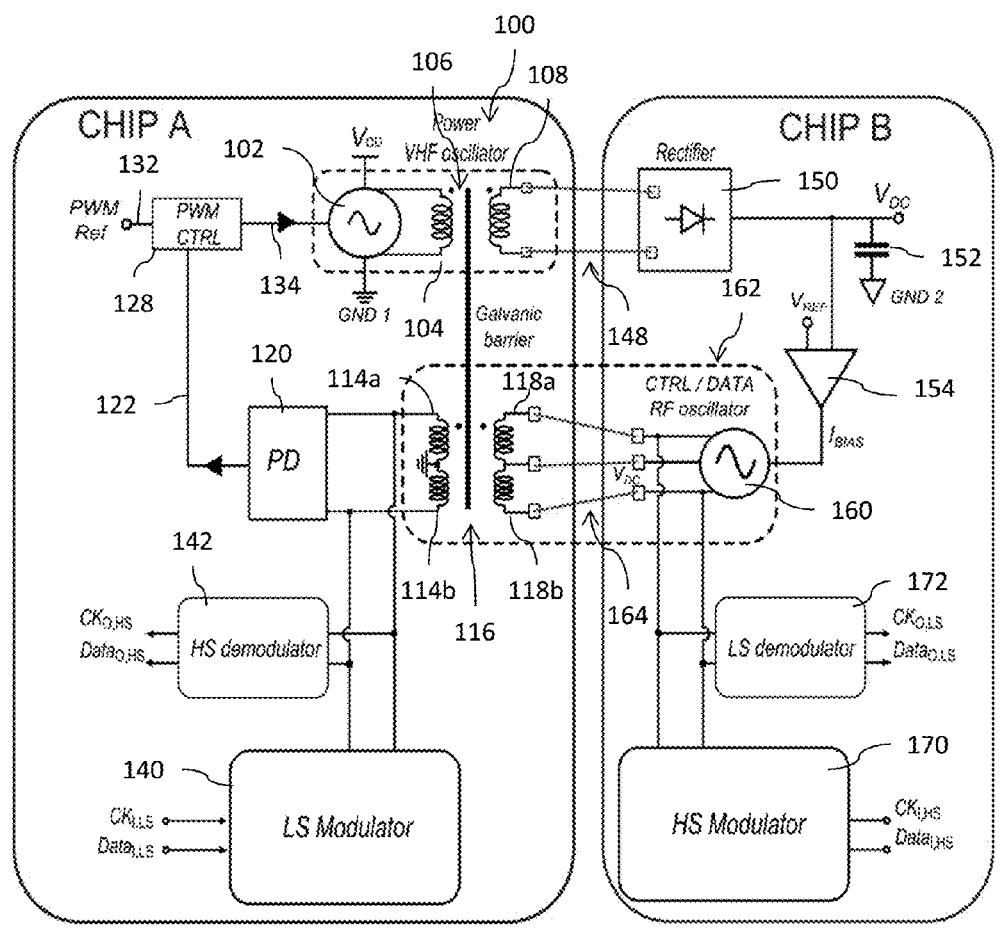
FIGS. 5-6 are diagrams showing a galvanically isolated dc-dc converter with bidirectional data transmission using an isolated link to transfer power with high efficiency and a feedback link to control the output dc voltage and further support a bidirectional half duplex communication.

Reference is now made to FIG. 5 showing a general implementation of a galvanically isolated dc-dc converter with bidirectional data transmission using an isolated link to transfer power with high efficiency and a feedback link to control the output dc voltage and further support a bidirectional half duplex communication.

A first integrated circuit chip (Chip A; also referred to as a circuit or interface) includes an oscillator 102 powered from a first supply voltage VDD referenced to a first ground voltage GND1. The output terminals of the oscillator 102 are coupled to the terminals of a primary winding 104 of a first transformer 106. A power very high frequency (VHF) oscillator 100 is formed by the oscillator 102 and first transformer 106. The first transformer 106 further includes a secondary winding 108 whose terminals are coupled to bonding pads of the first chip. The VHF frequency range for the oscillator signal output from the oscillator 100 may, for example, be 100-500 MHz according to the design tradeoff for the building block efficiency (i.e., oscillator, transformer, rectifier).

The first chip A further includes a second transformer 116 having a center-tapped secondary winding 114 formed by windings 114a and 114b that are series coupled at a node connected to the first ground voltage or $V_{DD}$. The second transformer 116 further includes a center-tapped primary winding 118 formed by windings 118a and 118b that are series coupled at a node with the terminals of winding 118 and the center tap node coupled to bonding pads of the first chip.

The transformers 106 and 116 form the galvanic barrier and support first and second galvanically isolated links, respectively, between the first and second chips.

A peak detector (PD) circuit 120 is coupled to the terminals of the secondary winding 114. The PD circuit 120 functions to detect the peak voltage of an oscillating signal present at the secondary winding 114. An output signal 122 from the PD circuit 120 indicative of that detected peak voltage is coupled to an input of a pulse width modulation (PWM) control circuit (CTRL) 128. The PWM CTRL circuit 128 includes a further input 132 configured to receive a PWM reference signal in the form of an oscillating square wave signal with a frequency of a few tens of kilohertz to a few hundreds of kilohertz. The PWM CTRL circuit 128 responds to the difference between the output signal 122 and the PWM reference voltage to generate a PWM control signal 134 that is applied to control actuation (on/off) of the oscillator 102.

The first chip A further includes a low speed (LS) modulator circuit 140 configured to receive a data signal (Data$_{1,LS}$) and a clock signal (CK$_{1,LS}$). Outputs of the LS modulator circuit 140 are coupled to the terminals of the secondary winding 114 (i.e., coupled to the chip A side of the galvanic barrier for the second galvanically isolated link). A high speed (HS) demodulator circuit 142 includes inputs also coupled to the terminals of the secondary winding 114. The HS demodulator outputs a data signal (Data$_{O,HS}$) and a clock signal (CK$_{O,HS}$).

A second integrated circuit chip (Chip B; also referred to as a circuit or interface) includes a rectifier circuit 150 having inputs coupled to bonding pads of the second chip. These bonding pads are coupled by bonding wires 148 to the bonding pads on the first chip associated with the terminals of the secondary winding 108 of the first transformer 106. An output voltage $V_{DC}$ is generated by the rectifier circuit 150. That output voltage is stored/filtered by an output capacitor 152 coupled to a second ground voltage (GND2).

A differential amplifier circuit 154 includes a first input coupled to receive the output voltage $V_{DC}$ and a second input coupled to receive a reference voltage $V_{REF}$. The circuit 154 operates to determine a difference between the output voltage $V_{DC}$ and reference voltage $V_{REF}$, and generate a control signal ($I_{BIAS}$) in a feedback path. The control signal ($I_{BIAS}$) is an error signal indicative of the error between the output voltage $V_{DC}$ and reference voltage $V_{REF}$. This error is fed back to the first chip A for use in controlling PWM actuation of the oscillator 102 to achieve regulation of the output voltage $V_{DC}$ relative to the reference voltage $V_{REF}$ by controlling power transfer from chip A to chip B.

The second chip B further includes an oscillator 160 including first, second and third output terminals coupled to bonding pads of the second chip. These bonding pads are coupled by bonding wires 164 to the bonding pads on the first chip associated with the terminals and center tap node of the primary winding 118 of the second transformer 116.

A control data RF oscillator 162 is accordingly formed by the oscillator 160 the second transformer 116. This control data radio frequency (RF) oscillator 162 is used to transmit the feedback error across the galvanic isolation to the first chip A with control signal ($I_{BIAS}$) causing a peak amplitude variation of the oscillation signal generated by the oscillator 160. The RF frequency range of the oscillator signal output by the oscillator 162 may, for example, be in the order of a few gigahertz.

The second chip B further includes a high speed (HS) modulator circuit 170 configured to receive a data signal (Data$_{I,HS}$) and a clock signal (CK$_{I,HS}$). Outputs of the HS modulator circuit 170 are coupled to the first and third terminals of the oscillator 160 and corresponding terminals of the primary winding 118 (i.e., coupled to the chip B side of the galvanic barrier for the second galvanically isolated link). A low speed (LS) demodulator circuit 172 includes inputs also coupled to the terminals of the primary winding 118. The LS demodulator outputs a data signal (Data$_{O,LS}$) and a clock signal (CK$_{O,LS}$).

Figure 6:
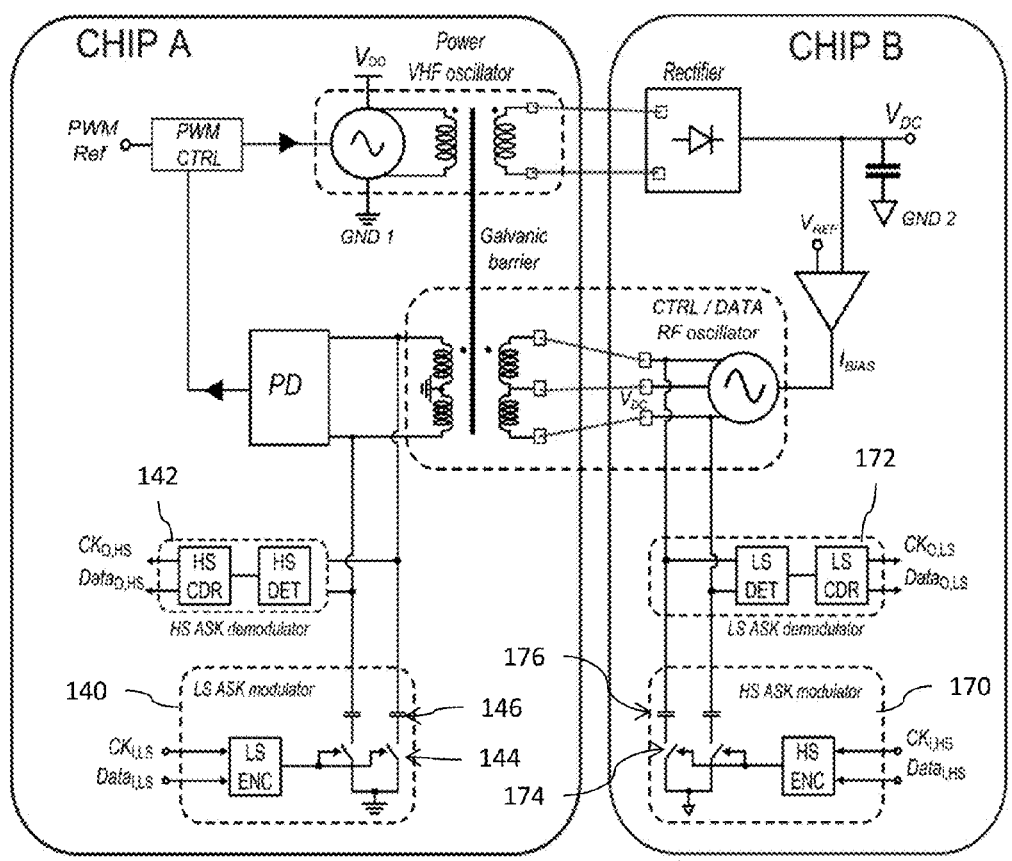

FIG. 6 shows a more detailed implementation of the galvanically isolated dc-dc converter with bidirectional data transmission. FIG. 6 specifically shows the circuitry of the modulators and demodulators for implementation of half-duplex data transmission using amplitude shift keying (ASK) modulation techniques.

The low speed (LS) modulator circuit 140 includes an encoder (ENC) circuit configured to receive the data signal (Data$_{I,LS}$) and clock signal (CK$_{I,LS}$). The encoder circuit generates control signals for controlling actuation of switching circuits 144 (such as, for example, transistor switches) that are coupled between the terminals of the secondary winding 114 and the first ground voltage. Capacitors 146 are coupled between the terminals of the secondary winding 114 and switching circuits 144. The LS modulator circuit 140 is accordingly coupled to the chip A side of the galvanic barrier for the second galvanically isolated link.

The high speed (HS) demodulator circuit 142 includes a demodulation detector (DET) circuit coupled to the terminals of the secondary winding 114. The output of the DET circuit is processed by clock and data recovery (CDR) circuit that outputs a data signal (Data$_{O,HS}$) and a clock signal (CK$_{O,HS}$). The HS demodulator circuit 142 is accordingly coupled to the chip A side of the galvanic barrier for the second galvanically isolated link.

The high speed (HS) modulator circuit 170 includes an encoder (ENC) circuit configured to receive the data signal (Data$_{I,HS}$) and clock signal (CK$_{I,HS}$). The encoder circuit generates control signals for controlling actuation of switching circuits 174 (such as, for example, transistor switches) that are coupled between the first and third terminals of the oscillator 160 (the terminals of the primary winding 114) and the second ground voltage. Capacitors 176 are coupled between the first and third terminals of the oscillator 160 (the terminals of the primary winding 114) and switching circuits 174. The HS modulator circuit 170 is accordingly coupled to the chip B side of the galvanic barrier for the second galvanically isolated link.

The low speed (LS) demodulator circuit 172 includes a demodulation detector (DET) circuit coupled to the first and third terminals of the oscillator 160 (the terminals of the primary winding 114). The output of the DET circuit is processed by clock and data recovery (CDR) circuit that outputs a data signal (Data$_{O,LS}$) and a clock signal (CK$_{O,LS}$). The LS demodulator circuit 172 is accordingly coupled to the chip B side of the galvanic barrier for the second galvanically isolated link.

The galvanically isolated dc-dc converter with bidirectional data transmission as shown in FIGS. 5 and 6 operates as follows. The output voltage $V_{DC}$ is delivered from the first chip A to second chip B by power transfer across the galvanic barrier using a power link i.e., the first galvanically isolated link) formed by the power VHF oscillator 100 that uses the first (isolation) transformer 106 as a resonant load and the rectifier circuit 150. The output voltage $V_{DC}$ is controlled in regulation by a feedback signal delivered from second chip B to first chip A across the galvanic barrier using a feedback isolated link (i.e., the second galvanically isolated link) formed by the CTRL RF oscillator 162 that uses the second (isolation) transformer 116 as a resonant load and the peak detector circuit 120. The control information of the feedback signal is generated by the differential amplifier 154 and is contained in the modulated amplitude of the RF control signal generated by the oscillator 160. This amplitude is easily detected by the peak detector circuit to generate the output signal 122 which drives the PWM CTRL circuit 128. The PWM control signal 134 turns the power oscillator 102 on and off with a frequency of a few hundreds of kilohertz, thus implementing a typical PWM modulation to vary the level of power transferred across the galvanic barrier for the first galvanically isolated link at maximum efficiency.

The feedback isolated link is further exploited to support a half-duplex data communication between chips A and B. By use of a desired modulation (for example, ASK as shown in FIG. 6) of the control signal at each winding of the isolation transformer 116, low speed (LS) data communication from chip A to chip B and high speed (HS) data communication from chip B to chip A may be accomplished by means of impedance mismatch at the transformer windings on one or the other side of the galvanic barrier through capacitors (references 146 and 176) and switch resistances (references 144 and 174). It is important that the adopted modulation (for example, amplitude shift keying ASK) preserve the peak of the RF signal which contains the control information. Typically, the maximum data rate from chip A to chip B is lower than the maximum data rate from chip B to chip A, hence the notations for low speed (LS) and high speed (HS). Each data channel includes a coding block (the encoder ENC) which encodes the data signal, a detector (DET) which demodulates the data signal and a clock/data recovery circuit (CDR). It will be noted that traditional coding schemes such as PWM or Manchester can be used.

In an embodiment, both isolation transformers 106 and 116 for the power link and the CTR/DATA link, respectively, are built within the first chip A. This can be implemented by the use of a thick oxide technology module as taught by United States Patent Application Publication No. 2015/0364249 (incorporated by reference) for data and power transfer applications. This means that the second chip B can be fabricated in a standard process (i.e., without any thick oxide module).

As far as the common mode transient (CMT) immunity is concerned, the differential center-tapped CTRL/DATA isolation transformer 116 provides low impedance paths for common mode currents for both transformer windings. Further CMT suppression circuitries can be also included in the demodulator (DET) circuits.

The architecture of FIGS. 5-6 presents the following advantages with respect known prior art solutions:

a) It increases the level of integration, thus reducing the silicon area and system costs by exploiting the power control isolated channel (already available) to provide also bidirectional data communication: For integrated isolated dc-dc converters the silicon area consumed by the isolation transformers can be as high as 50% of the overall area.

b) It requires similar area with respect to a simple power link with PWM feedback control loop without data communication: It is possible to implement data communication on a traditional isolated dc-dc converter without significantly affecting area or overall efficiency performance.

c) CMT immunity and power efficiency do not require to be traded-off since two different isolation transformers operating at different frequencies (i.e., VHF and RF) are exploited: Since the VHF power link has a dedicated transformer, it can be as large as necessary to optimize both power and efficiency, while CMT immunity is mainly determined by the parasitic primary to secondary winding capacitance of the CTRL/DATA transformer. This transformer is much smaller since is typically operated at RF frequencies and therefore parasitic capacitances are low.

d) It is suitable to data rate of tens of Mbit/s: The data rate is not limited by the power signal frequency since data communication is implemented on the control link.

e) The output power can be several hundreds of milliwatts. The level of the delivered output power is not limited by the architecture since it is an almost free design parameter.

The architecture can be easily applied also to a reinforced isolated system as taught by: "Surging across the barrier: Digital isolators set the standard for reinforced insulation," Analog Devices, Inc., Tech. article, 2012, MS-2341 (incorporated by reference); Kamath, et al., "High-voltage reinforced isolation: Definitions and test methodologies," Texas Instruments, Tech. article, November 2014, SLYY063 (incorporated by reference); and Cantrell, "Reinforced isolation in data couplers," Analog Devices, Inc., Tech. article, 2011, MS-2242 (incorporated by reference). To this aim, both chips A and B use the thick-oxide technology module and series isolation capacitors are added in the power and CTRL/DATA links, while exploiting an LC resonance to minimize losses (as taught by U.S. application patent Ser. No. 15/163,430 filed May 24, 2016, the disclosure of which is incorporated by reference).

Without prejudice to the underlying principles, the details and embodiments may vary, even significantly, with respect to what has been disclosed by way of example only, without departing from the extent of protection.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. A galvanic isolation system, comprising:
a first galvanically isolated link configured to transfer power from a first circuit to a second circuit across a galvanic barrier; and
a second galvanically isolated link configured to feed back an error signal from the second circuit to the first circuit across the galvanic barrier for use in regulating the power transfer and further configured to support bidirectional data communication between the first and second circuits across the galvanic barrier, said second galvanically isolated link comprising:
a first oscillator of the second circuit providing a radio frequency (RF) control signal modulated by said error signal;
a first transformer having a primary winding coupled to outputs of said first oscillator and a secondary winding coupled to the first circuit;
at least one first electronic switch coupled in series with at least one capacitor coupled to the secondary winding of the first transformer and configured to modify an impedance of the secondary winding to modulate the RF control signal with first data communicated from the first circuit to the second circuit; and
at least one second electronic switch coupled in series with at least one capacitor coupled to the primary winding of the first transformer and configured to modify an impedance of the primary winding to modulate the RF control signal with second data communicated from the second circuit to the first circuit.

2. The system of claim 1, wherein the first galvanically isolated link comprises:
a second oscillator of the first circuit; and
a second transformer having a primary winding coupled to outputs of the first oscillator and a secondary winding coupled to the second circuit.

3. The system of claim 2, wherein the second circuit comprises a rectifier circuit coupled to the secondary winding of the second transformer and configured to convert the power transfer to a DC output voltage.

4. The system of claim 3, wherein the second circuit further comprises an error amplifier configured to determine a difference between the DC output voltage and a reference voltage and generate said error signal in response thereto.

5. The system of claim 4, wherein said error signal changes a peak amplitude of an oscillator signal generated by said first oscillator.

6. The system of claim 5, wherein the first circuit comprises:
a detector circuit coupled to the secondary winding of the first transformer and configured to detect said peak amplitude to generate a control signal; and
a control circuit responsive to said control signal and configured to control the first oscillator to regulate power transfer from the first circuit to the second circuit across the galvanic barrier.

7. The system of claim 6, wherein the control circuit comprises a pulse width modulation (PWM) control circuit responsive to said control signal and configured to generate a PWM switching signal for controlling on and off actuation of the second oscillator.

8. The system of claim 1, wherein the primary of the first transformer comprises two end taps and a center tap, the center tap being coupled to a common node of the second circuit.

9. The system of claim 8, wherein the at least one second electronic switch comprises two electronic switches, each electronic switch coupled to an end tap of the primary of the first transformer and coupled through a series capacitor to said common node of the second circuit.

10. The system of claim 9, wherein each electronic switch is controlled separately by the second encoder.

11. The system of claim 1, wherein the secondary of the first transformer comprises two end taps and a center tap, the center tap being coupled to a common node of the first circuit.

12. The system of claim 11, wherein the at least one first electronic switch comprises two electronic switches, each electronic switch coupled to an end tap of the secondary of the first transformer and coupled through a series capacitor to the common node of the first circuit.

13. The system of claim 12, wherein each electronic switch is controlled separately by the first encoder.

\* \* \* \* \*